(12) United States Patent
Park et al.

(10) Patent No.: US 12,133,403 B2
(45) Date of Patent: Oct. 29, 2024

(54) COLOR CONVERSION PANEL AND DISPLAY DEVICE INCLUDING THE SAME, AND MANUFACTURING METHOD THEREOF

(71) Applicant: Samsung Display Co., LTD., Yongin-si (KR)

(72) Inventors: Ki Soo Park, Hwaseong-si (KR); Jung Hyun Kwon, Yongin-si (KR); Hyo Joon Kim, Suwon-si (KR); Yun Ha Ryu, Hwaseong-si (KR); Seon-Tae Yoon, Hwaseong-si (KR); Hye Seung Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/484,166

(22) Filed: Oct. 10, 2023

(65) Prior Publication Data

US 2024/0040815 A1     Feb. 1, 2024

Related U.S. Application Data

(62) Division of application No. 17/149,223, filed on Jan. 14, 2021, now Pat. No. 11,818,909.

(30) Foreign Application Priority Data

Apr. 20, 2020     (KR) .................. 10-2020-0047558

(51) Int. Cl.
| | | |
|---|---|---|
| *H10K 50/13* | (2023.01) | |
| *H10K 50/115* | (2023.01) | |
| *H10K 50/86* | (2023.01) | |
| *H10K 59/38* | (2023.01) | |

(52) U.S. Cl.
CPC ......... *H10K 50/131* (2023.02); *H10K 50/115* (2023.02); *H10K 50/865* (2023.02); *H10K 59/38* (2023.02)

(58) Field of Classification Search
None
See application file for complete search history.

(56) References Cited

U.S. PATENT DOCUMENTS

| | | | |
|---|---|---|---|
| 2018/0203292 A1* | 7/2018 | Kim | .................. G02F 1/133617 |
| 2019/0018286 A1* | 1/2019 | Kim | .................. G02F 1/133504 |
| 2019/0137815 A1 | 5/2019 | Kim et al. | |
| 2020/0168667 A1 | 5/2020 | Kim et al. | |

FOREIGN PATENT DOCUMENTS

| | | |
|---|---|---|
| CN | 110707146 | 1/2020 |
| KR | 10-2018-0018969 | 2/2018 |
| KR | 10-2018-0052912 | 5/2018 |
| WO | 2010/146653 | 12/2010 |

\* cited by examiner

*Primary Examiner* — Daniel Whalen
(74) *Attorney, Agent, or Firm* — KILE PARK REED & HOUTTEMAN PLLC

(57) ABSTRACT

A color conversation panel according to an embodiment may include partitioning walls disposed on a substrate, reflective layers disposed on outer surfaces of the partitioning walls, overcoats disposed outside on outer surfaces of the reflective layers and having water repellency, a spacer overlapping a part of the partitioning walls and protruding from a part of the overcoats, the spacer and the overcoats being formed on a same layer, and color conversion layers disposed on the overcoats and disposed in areas defined by the partitioning walls.

7 Claims, 12 Drawing Sheets

COLOR CONVERSION PANEL AND DISPLAY DEVICE INCLUDING THE SAME, AND MANUFACTURING METHOD THEREOF

CROSS-REFERENCE TO RELATED APPLICATION(S)

This is a divisional application of U.S. patent application Ser. No. 17/149,223 filed Jan. 14, 2021 (now pending), the disclosure of which is incorporated herein by reference in its entirety. U.S. patent application Ser. No. 17/149,223 claims priority to and benefits of Korean Patent Application No. 10-2020-0047558 under 35 U.S.C. § 119, filed Apr. 20, 2020, in the Korean Intellectual Property Office, the entire contents of which are incorporated herein by reference.

BACKGROUND

1. Field

The disclosure relates to a color conversion panel, a display device including the color conversion panel, and a manufacturing method thereof.

2. Description of the Related Art

A color conversion panel and a display device including the same have been proposed to reduce light loss in a flat panel display and to display colors with high efficiency.

It is necessary to increase efficiency of color-converted light in the color conversion panel and at the same time effectively manufacture the color conversion layer.

When a gap between a display panel and the color conversion panel of the display device is not constant, display quality deterioration may occur and thus brightness may be changed depending on the location of the gap.

A photolithography process is required in the manufacture of the color conversion panel, and manufacturing cost is increased as the number of exposure masks used in the photolithography process is increased.

The above information disclosed in this Background section is only for the enhancement of understanding the background of the invention, and therefore it may contain information that does not form the prior art that is already known to a person of ordinary skill in the art.

SUMMARY

Embodiments provide a color conversion panel that may improve color conversion efficiency of the color conversion panel and maintain a constant gap between a display panel and a color conversion panel of a display device, and a display device including the same, and a manufacturing method that can prevent an increase of manufacturing cost by reducing the number of exposure masks in the manufacturing process.

The invention is not limited to the above-described purpose, and the disclosure may be variously extended in a range that does not deviate from the spirit and scope of the present invention.

A color conversation panel according to an embodiment may comprise partitioning walls disposed on a substrate, reflective layers disposed on outer surfaces of the partitioning walls, overcoats disposed on outer surfaces of the reflective layers and having water repellency, a spacer overlapping a part of the partitioning walls and protruding from a part of the overcoats, the spacer and the overcoats being formed on a same layer, and color conversion layers disposed on the overcoats and disposed in areas defined by the partitioning walls.

The color conversion layers may include quantum dots.

The color conversion panel may further include a transparent filter layer disposed on the overcoats and disposed in an area defined by the partitioning walls, and transmits light of a first wavelength.

The color conversion layers may include a first color conversion layer that converts the light of the first wavelength to light of a second wavelength, and a second color conversion layer that converts the light of the first wavelength into light of a third wavelength that is different from the light of the second wavelength.

The color conversion panel may further include a blocking layer disposed between the substrate, and the first color conversion layer and the second color conversion layer, wherein the blocking layer may absorb the light of the first wavelength.

The color conversion panel may further include a first color filter, a second color filter, and a third color filter disposed between the substrate, and the first color conversion layer and the second color conversion layer. The first color filter may overlap the transparent filter layer and transmit the light of the first wavelength. The second color filter may overlap the first color conversion layer and transmit the light of the second wavelength. The third color filter may overlap the second color conversion layer and transmit the light of the third wavelength.

A display device according to an embodiment may comprise a display panel including a first substrate, a second substrate facing the first substrate, partitioning walls disposed between the first substrate and the second substrate, reflective layers disposed on outer surfaces of the partitioning walls, overcoats disposed on outer surfaces of the reflective layers and having water repellency, a spacer overlapping a part of the partitioning walls and protruding from a part of the overcoats, the spacer and the overcoats being formed on a same layer, and color conversion layers adjacent to the overcoats and disposed in areas defined by the partitioning walls.

The display panel may include an organic light emitting diode, and the organic light emitting diode may emit light of a first wavelength.

The color conversion layers may include quantum dots.

The display device may further include a transparent filter layer disposed on the overcoats and disposed in an area defined by the partitioning walls, the transparent filter layer transmitting light of the first wavelength.

The color conversion layer lay include a first color conversion layer that converts the light of the first wavelength to light of a second wavelength, and a second color conversion layer that converts the light of the first wavelength to light of a third wavelength that is different from the light of the second wavelength.

The display device may further include a blocking layer disposed between the second substrate, and the first color conversion layer and the second color conversion layer. The blocking layer may absorb the light of the first wavelength.

The display device may further include a first color filter, a second color filter, and a third color filter disposed between the second substrate, and the first color conversion layer and the second color conversion layer. The first color filter may overlap the transparent filter layer and transmit the light of the first wavelength. The second color filter may overlap the first color conversion layer and transmit the light of the second wavelength. The third color filter may overlap the second color conversion layer and transmit the light of the third wavelength.

A color conversion panel forming method according to an embodiment may include forming partitioning walls on a substrate, disposing a metal layer and a water-repellent layer on the substrate, forming overcoats on the partitioning walls and forming a spacer protruding from a part of the overcoats by patterning the water-repellent layer with an exposure mask that includes three areas, each of the three areas having a different light transmittance, forming a reflective layer disposed between the partitioning walls and the overcoats by etching the metal layer using the overcoats and the spacer as a mask, and forming a color conversion layer disposed on the overcoats in an area defined by the partitioning walls.

The water-repellent layer may include a transparent organic component, and may have water repellency.

The color conversion layer may be formed using an inkjet method.

The three areas of the exposure mask may include a first area where the water repellent layer is fully removed, a second area where the partitioning walls are formed, and a third area where the spacer is formed.

The overcoats and the spacer may include transparent organic components, and may have water repellency.

The metal layer may include a reflective metal.

The color conversion layer may include quantum dots.

According to the embodiments, the color conversion panel and the display device including the same can improve color conversion efficiency of the color conversion panel, and can maintain a constant gap between the display panel and the color conversion panel of the display device. The number of exposure masks in the manufacturing process can be reduced, thereby preventing an increase of manufacturing cost.

The effect of the present invention is not limited to the above-described effect, and it is obvious that it can be variously extended in a range that does not deviate from the spirit and scope of the present invention.

DETAILED DESCRIPTION OF THE EMBODIMENTS

Figure 1:
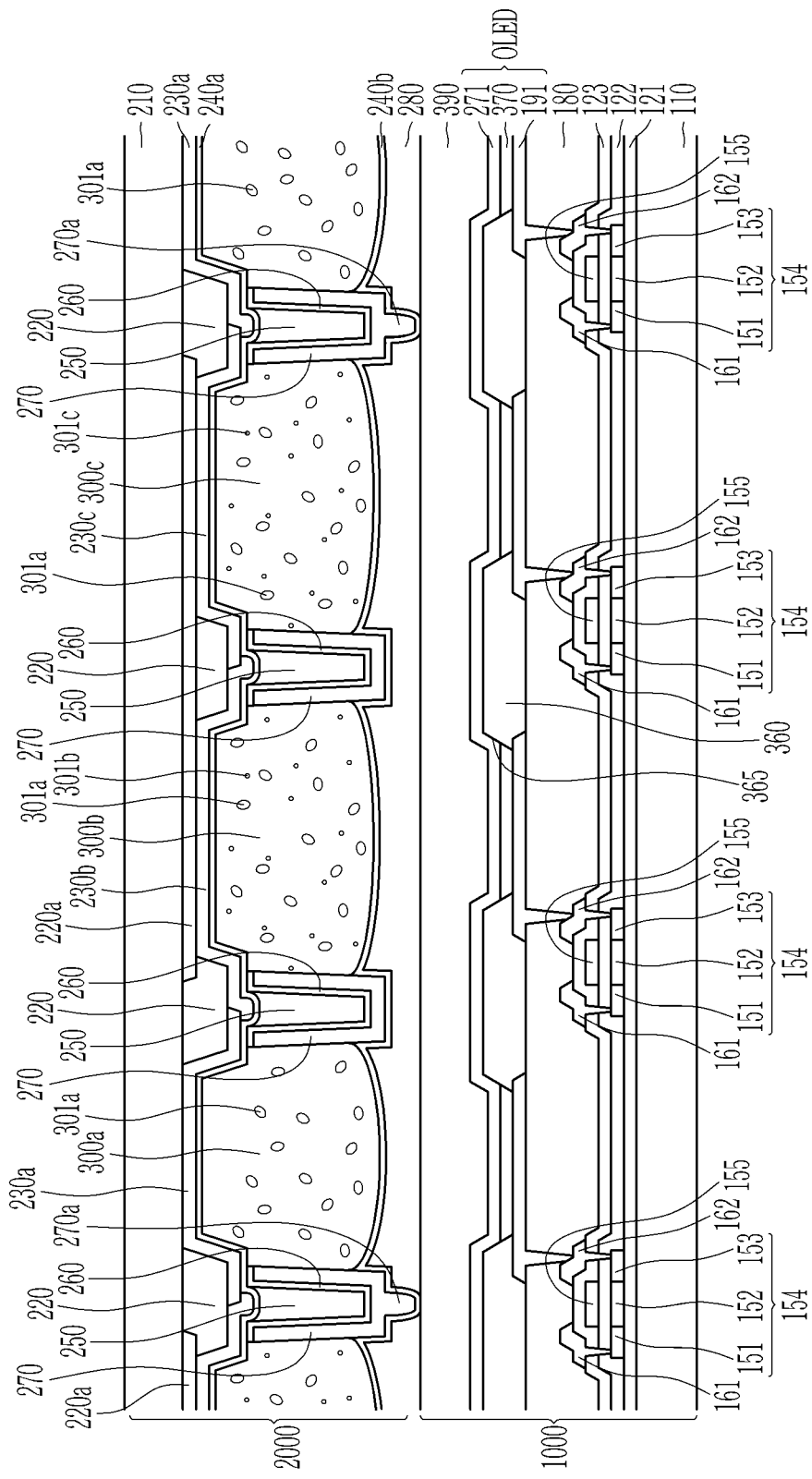
FIG. 1 is a schematic cross-sectional view of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly describe the invention, parts that are irrelevant to the description are omitted, and the same reference numerals designate like or similar elements throughout the specification.

Since the size and thickness of each component shown in the drawing are arbitrarily shown for better understanding and ease of description, the invention is not necessarily limited to what is shown. In the drawings, the thickness of layers, films, panels, regions, etc., are exaggerated for clarity. In the drawings, the thickness of some layers and regions may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the terms "comprises," "comprising," "includes," "including," "have," "having," "contains," and/or "containing" when used in this specification, are intended to specify the presence of stated features, regions, integers, steps, operations, elements, and/or components, but do not preclude the presence or addition of one or more other features, regions, integers, steps, operations, elements, components, and/or groups thereof.

Further, in this specification, the phrase "on a plane" means viewing a target portion from the top, and the phrase "on a cross-section" means viewing a cross-section formed by vertically cutting a target portion from the side.

Throughout the specification, it will be understood that when an element is referred to as being related to another element such as being "coupled to", "connected to", or "contacting" another element, it can be directly coupled to, connected to, or contacting the other element or intervening elements may be present therebetween. In contrast, it should be understood that when an element is referred to as being related to another element such as being "directly coupled to", "directly connected to", or "directly contacting" another element, there are no intervening elements present. Other expressions that explain the relationship between elements, such as "between," "directly between," "adjacent to," or "directly adjacent to," should be construed in the same way.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +20%, 10%, or 5% of the stated value.

Referring to FIG. 1, a display device according to an embodiment will be schematically described. FIG. 1 is a schematic cross-sectional view of a display device according to an embodiment.

Referring to FIG. 1, a display device according to an embodiment includes a display panel 1000 and a color conversion panel 2000. Although it is not illustrated, the display device may further include a touch portion, and the touch portion may be disposed between the display panel 1000 and the color conversion panel 2000.

The display panel 1000 will be described.

The display panel 1000 includes a first substrate 110, and a buffer layer 121 is disposed on the first substrate 110. The first substrate 110 may include flexible materials such as plastic, and thus it may be flexible, bendable, foldable, or rollable.

The buffer layer 121 may include a silicon nitride (SiNx) or a silicon oxide (SiOx). The buffer layer 121 may be disposed between the substrate 110 and a semiconductor layer 154 and thus improves a characteristic of polysilicon by blocking impurities from the substrate 110 in the crystallization process to form the polysilicon, and planarizes the substrate 110 to relieve stress of the semiconductor layer 154 formed on the buffer layer 121.

The semiconductor layer 154 is disposed on the buffer layer 121. The semiconductor layer 154 may be formed of a polysilicon or oxide semiconductor. The semiconductor layer 154 includes a channel region 152, a source region 151, and a drain region 153. The source region 151 and the drain region 153 are disposed at opposite sides of the channel region 152. The channel region 152 is an intrinsic semiconductor that is not doped with an impurity, and the source region 151 and the drain region 153 are impurity semiconductors that are doped with a conductive impurity. The semiconductor layer 154 may be formed of an oxide semiconductor, and a separate passivation layer (not shown) may be added to protect a semiconductor oxide material that is weak to an external environment such as high temperature and the like.

A gate insulating layer 122 is disposed on the semiconductor layer 154 to cover the semiconductor layer 154. The gate insulating layer 122 may be a monolayer or a multilayer including at least one of a silicon nitride (SiNx) and a silicon oxide (SiO$_2$).

A gate electrode 155 is disposed on the gate insulating layer 122. The gate electrode 155 may be a multilayer stacked with a metal film including any one of copper (Cu), a copper alloy, aluminum (Al), an aluminum alloy, molybdenum (Mo), and a molybdenum alloy.

An interlayer insulating layer 123 is disposed on the gate electrode 155 and the gate insulating layer 122. The interlayer insulating layer 123 may include a silicon nitride (SiNx) or a silicon oxide (SiO$_2$). An opening that exposes the source region 151 and the drain region 153 may be disposed in the interlayer insulating layer 123.

A source electrode 161 and a drain electrode 162 are formed on the interlayer insulating layer 123. The source electrode 161 and the drain electrode 162 are respectively connected with the source region 151 and the drain region 153 of the semiconductor layer 154 through openings formed in the interlayer insulating layer 123 and the gate insulating layer 122.

A passivation layer 180 is disposed on the interlayer insulating layer 123, the source electrode 161, and the drain electrode 162. The passivation layer 180 may planarize the interlayer insulating layer 123, the source electrode 161, and the drain electrode 162 by covering them, and thus a pixel electrode 191 can be formed on the passivation layer 180 without generating a step. Such a passivation layer 180 may be made of an organic material such as a polyacryl-based resin or a polyimide resin, or a laminated film of an organic material and an inorganic material.

The pixel electrode 191 is disposed on the passivation layer 180. The pixel electrode 191 may be connected with the drain electrode 162 through an opening of the passivation layer 180.

A driving transistor formed of the gate electrode 155, the semiconductor layer 154, the source electrode 161, and the drain electrode 162 is connected to the pixel electrode 191 and thus supplies a driving current to an organic light emitting diode OLED. The display device according to the embodiment may further include a switching transistor (not shown) that may be connected to a data line and may transmit a data voltage in response to a scan signal and a compensation transistor (not shown) that is connected with the driving transistor and compensates a threshold voltage of the driving transistor in response to the scan signal, in addition to the driving transistor shown in FIG. 1.

A pixel defining layer 360 is disposed on the passivation layer 180 and the pixel electrode 191, and may include a pixel opening 365 that overlaps the pixel electrode 191 and defines a light emission area. The pixel defining layer 360 may include an organic material such as a polyacryl-based resin and a polyimide resin, or a silica-based inorganic material. The pixel opening 365 may have a planar shape that may be similar to the pixel electrode 191. The pixel opening 365 may have a rhombus or an octagonal shape, but is not limited thereto, and may have any shape such as a quadrangle, a polygon, and the like.

An organic emission layer 370 is disposed on the pixel electrode 191 that overlaps the pixel opening 365. The organic emission layer 370 may be made of a low molecular organic material or a high molecular organic material such as PEDOT (poly(3,4-ethylenedioxythiophene)).

The organic emission layer 370 may be a multilayer including one or more of a hole injection layer (HIL), a hole transport layer (HTL), an electron transport layer (ETL), and an electron injection layer (EIL).

The organic emission layer 370 may be mostly disposed in the pixel opening 365, and may also be disposed in a side or above the pixel defining layer 360.

A common electrode 271 is disposed on the organic emission layer 370. The common electrode 271 may be disposed over pixels, and may receive a common voltage through a common voltage transmission portion (not shown) in a non-display area.

The pixel electrode 191, the organic emission layer 370, and the common electrode 271 may form an organic light emitting diode OLED.

The pixel electrode 191 may be an anode, which is a hole injection electrode, and the common electrode 271 may be a cathode, which is an electron injection electrode. However, the embodiment is not limited thereto, and the pixel electrode 191 may be a cathode and the common electrode 271 may be an anode depending on a driving method of an organic light emitting diode (OLED) display.

Holes and electrons may be injected into the organic emission layer 370 from the pixel electrode 191 and the common electrode 271, respectively, and light emission may be performed when an exciton that is produced when the injected hole and electron are combined falls from an excited state to a ground state.

An encapsulation layer 390 is disposed on the common electrode 271. The encapsulation layer 390 may encapsulate a display layer that includes the organic light emitting diode OLED while not only covering the top surface of the display layer but also covering side surfaces thereof.

Since the organic light emitting diode is very weak to moisture and oxygen, the encapsulation layer 390 blocks introduction of external moisture and oxygen by encapsulating the display layer. The encapsulation layer 390 may include layers and may be formed of a complex layer including inorganic layers and organic layers. For example, the encapsulation layer 390 may be provided as a triple layer in which an inorganic layer, an organic layer, and an inorganic layer are sequentially formed.

The color conversion panel 2000 is disposed on the encapsulation layer 390.

The color conversion panel 2000 includes a second substrate 210 that faces the first substrate 110 of the display panel 1000. The second substrate 210 may include a flexible material such as plastic so as to be flexible, bendable, foldable, or rollable.

A light blocking member 220, first to third color filters 230a, 230b, and 230c, a first insulation layer 240a, a partitioning wall 250, a reflective layer 260, an overcoat 270, a spacer 270a, a transparent filter layer 300a, a first color conversion layer 300b, a second color conversion layer 300c, and a second insulation layer 240b are disposed between the second substrate 210 and the display panel 1000, and a filling layer 280 is disposed between the second insulation layer 240b and the display panel 1000. A blocking layer 220a is disposed between the second substrate 210, and the second color filter 230b and the third color filter 230c.

The light blocking member 220, the partitioning wall 250, the reflective layer 260, and the overcoat 270 may be disposed to overlap the pixel defining layer 360 of the display panel 1000. For example, the light blocking member 220, the partitioning wall 250, the reflective layer 260, and the overcoat 270 are disposed to be overlapped with an opaque area of the display panel 1000, and the transparent filter layer 300a, the first color conversion layer 300b, and the second color conversion layer 300c are disposed to be overlapped with the light emission area of the display panel 1000. The partitioning wall 250, the reflective layer 260, and the overcoat 270 are provided in plural, and a part of the overcoats 270 includes the spacer 270a which protrudes therefrom.

The transparent filter layer 300a, the first color conversion layer 300b, and the second color conversion layer 300c are disposed in areas surrounded by partitioning walls 250.

The organic light emitting diode OLED may emit light of a first wavelength, and the transparent filter layer 300a may include scatterers 301a. The first color conversion layer 300b converts light of the first wavelength entering from the display panel 1000 into light of a second wavelength, and includes scatterers 301a and first quantum dots 301b. The second color conversion layer 300c converts the light of the first wavelength entering from the display panel 1000 into light of a third wavelength, and includes scatterers 301a and second quantum dots 301c.

The light of the first wavelength may be blue light for which the maximum light emission peak wavelength is in a range of about 380 nm to about 480 nm. For example, the maximum light emission peak wavelength may be about 420 nm or more, about 430 nm or more, about 440 nm or more, or about 445 nm or more and about 470 nm or less, about 460 nm or less, or about 455 nm or less.

The light of the second wavelength may be green light of which the maximum light emission peak wavelength is in a range of about 500 nm to about 550 nm. For example, the maximum light emission peak wavelength may be in a range of about 510 nm to about 550 nm.

The light of the third wavelength may be red light of which the light emitting peak wavelength is in a range of about 600 nm to about 650 nm. For example, the maximum light emission peak wavelength may be in a range of about 620 nm to about 650 nm.

The first color filter 230a transmits the light of the first wavelength passed through the transparent filter layer 300a and absorbs light of remaining wavelengths such that purity of the light of the first wavelength, emitted toward the second substrate 210 after passing through the transparent filter layer 300a, can be increased. The second color filter 230b transmits the light of the second wavelength and absorbs light of remaining wavelengths such that purity of the light of the second wavelength, emitted toward the second substrate 210 after passing through the first color conversion layer 300b, can be increased. The third color filter 230c transmits the light of the third wavelength and absorbs light of remaining wavelengths such that purity of the light of the third wavelength, emitted toward the second substrate 210 after passing through the second color conversion layer 300c, can be increased.

The blocking layer 220a is disposed at a position overlapping the first color conversion layer 300b and the second color conversion layer 300c, and may block (e.g., absorb) the light of the first wavelength remaining without being color-converted in the first color conversion layer 300b and the second color conversion layer 300c and thus emitting toward the second substrate 210, thereby increasing the purity of the light of the second wavelength and the purity of the light of the third wavelength, passed through the first color conversion layer 300b and the second color conversion layer 300c, respectively.

The blocking layer 220a may substantially block (e.g., absorb) the light of the first wavelength and may transmit light of remaining wavelengths. For example, the blocking layer 220a substantially blocks blue light in a range of about 500 nm or less, and may transmit light of the remaining visible light wavelength range of more than about 500 nm and 700 nm or less. For example, the blocking layer 220a may absorb about 80% or more, about 90% or more, or about 95% or more of blue light of about 500 nm or less, and may have light transmittance of about 70% or more, about 80% or more, about 90% or more, or about 100% with respect to the remaining visible light in a range of about 500 nm to about 700 nm.

The light passed through the transparent filter layer 300a, the first color conversion layer 300b, and the second color conversion layer 300c may be reflected by the reflective layer 260 that surrounds an external surface of the partitioning wall 250 and thus is emitted to the outside, thereby increasing light efficiency. For example, compared to a case in which the reflective layer 260 is not provided, light efficiency may be increased by at least about 20%.

The overcoat 270 covering the reflective layer 260 has water repellency, and thus when the transparent filter layer 300a, the first color conversion layer 300b, and the second color conversion layer 300c are formed by using an inkjet method, the overcoat 270 may help inkjet solution to be disposed inside an area defined by the partitioning wall 250 rather than on the partitioning wall 250.

The partitioning wall 250, the reflective layer 260, and the overcoat 270 are provided in plural, and a part of the overcoats 270 includes the spacer 270a.

A constant gap between the display panel 1000 and the transparent filter layer 300a, the first color conversion layer 300b, and the second color conversion layer 300c can be maintained by the spacers 270a protruding from parts of the overcoats 270.

The reflective layer 260, the overcoat 270, and the spacer 270a may be formed by one exposure mask, and accordingly, an increase of manufacturing cost can be prevented. This will be described in detail later.

Figure 2:
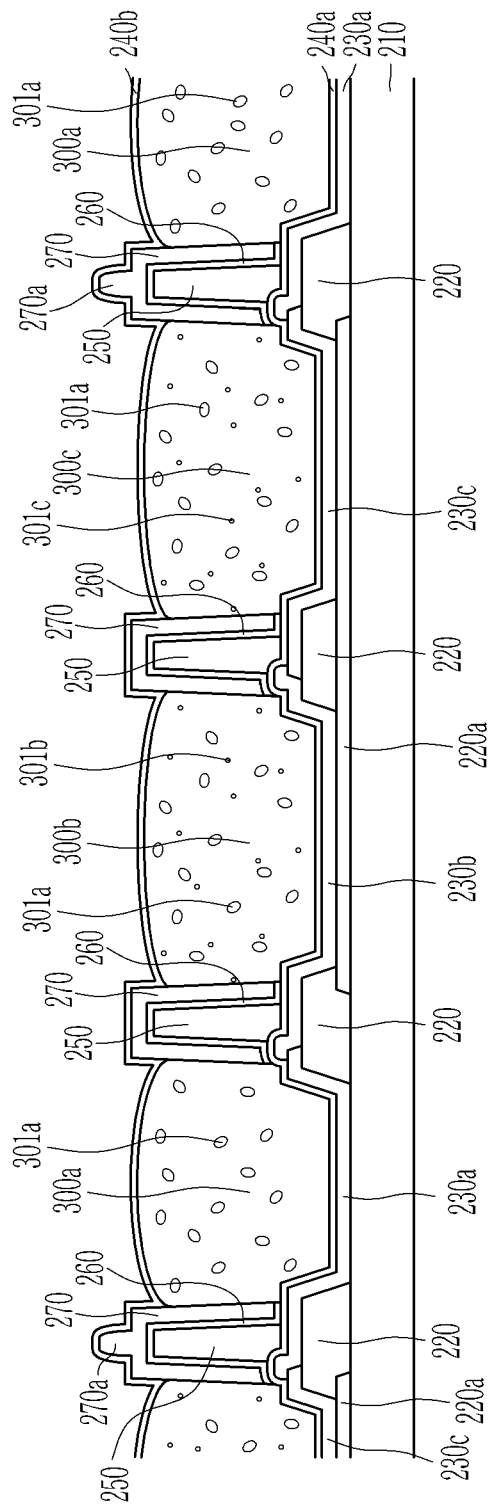
FIG. 2 is a schematic cross-sectional view of a color conversion panel according to the embodiment.

Referring to FIG. 1 and FIG. 2, a color conversion panel 2000 according to the embodiment will now be described in detail. FIG. 2 is a schematic cross-sectional view of a color conversion panel according to an embodiment.

Referring to FIG. 2 together with FIG. 1, a color conversion panel 2000 according to an embodiment includes a second substrate 210 and a light blocking member 220 disposed on the second substrate 210.

The second substrate 210 may include a flexible material such as plastic and the like so as to be flexible, bendable, foldable, or rollable.

The light blocking member 220 prevents light passing through each of the transparent filter layer 300a, the first color conversion layer 300b, and the second color conversion layer 300c from being mixed and viewed together, thereby increasing the contrast ratio of the display device.

A first color filter 230a, a second color filter 230b, and a third color filter 230c are disposed on the second substrate 210 and the light blocking member 220.

A blocking layer 220a is disposed between the second color filter 230b and third color filter 230c, and the second substrate 210. The blocking layer 220a is not disposed in an area overlapping the first color filter 230a.

A first insulation layer 240a is disposed on the first color filter 230a, the second color filter 230b, and the third color filter 230c. The first insulation layer 240a prevents components of the first color filter 230a, the second color filter 230b, and the third color filter 230c from spreading to the outside.

A partitioning wall 250 is disposed at a position overlapping the light blocking member 220. The partitioning walls 250 may define areas where the transparent filter layer 300a, the first color conversion layer 300b, and the second color conversion layer 300c are respectively disposed.

A reflective layer 260 is disposed on a portion of an outer surface of the partitioning wall 250, not contacting the light blocking member 220 and the color filters 230a, 230b, and 230c, which are side surfaces and the top surface of the partitioning wall 250 in FIG. 2.

The reflective layer 260 may include a metal that reflects light, for example, aluminum (Al) or silver (Ag). The reflective layer 260 reflects the light incident on the partitioning wall 250, and then emits light toward the second substrate 210, thereby increasing light efficiency. For example, compared to a case that the reflective layer 260 is not provided, light efficiency may be increased by at least about 20%.

An overcoat 270 and a spacer 270a are disposed on the reflective layer 260. Outer edges of the reflective layer 260 and overcoat 270 may vertically overlap. The reflective layer 260 and the overcoat 270 may be formed together, and this will be described in detail later. Accordingly, the reflective layer 260 and the overcoat 270 may have a same planar shape. Although it is not illustrated, the planar shape of each of the partitioning wall 250, the reflective layer 260, and the overcoat 270 may have a polygon shape such as a circle, an oval, or a quadrangle.

The overcoat 270 and the spacer 270a may be simultaneously formed in a same layer, may include a transparent organic material, and may have water repellency to repel liquid.

The overcoat 270 having water repellency surrounds the reflective layer 260 disposed on the partitioning wall 250, and thus, when the transparent filter layer 300a, the first color conversion layer 300b, and the second color conversion layer 300c are formed by using an inkjet method, discharged liquid that forms the transparent filter layer 300a, the first color conversion layer 300b, and the second color conversion layer 300c can be dispersed toward areas partitioned by the partitioning walls 250 rather than being dispersed upward of the partitioning walls 250.

The partitioning wall 250, the reflective layer 260, and the overcoat 270 are provided in plural, and parts of the overcoats 270 include spacers 270a.

A constant gap between the display panel 1000 and the transparent filter layer 300a, the first color conversion layer 300b, and the second color conversion layer 300c can be maintained by the spacers 270a protruding from parts of the overcoats 270.

The transparent filter layer 300a, the first color conversion layer 300b, and the second color conversion layer 300c are disposed in the areas defined by the partitioning walls 250.

A display panel 1000 that emits light to the color conversion panel 2000 may emit light of a first wavelength, and the transparent filter layer 300a may transmit light of the first wavelength and may include scatterers 301a.

The first color conversion layer 300b converts light of the first wavelength entering from the display panel 1000 into light of a second wavelength, and may include scatterers 301a and first quantum dots 301b. The second color conversion layer 300c converts light of the first wavelength entering from the display panel 1000 into light of a third wavelength, and may include scatterers 301a and second quantum dots 301c.

The scatterers 301a scatter light incident on the transparent filter layer 300a, the first color conversion layer 300b, and the second color conversion layer 300c to increase light efficiency.

The first quantum dot 301b and the second quantum dot 301c may be selected from group II-VI compounds, group III-V compounds, group IV-VI compounds, group IV elements, group IV compounds, and combinations thereof.

The group II-VI compounds may be selected from a group consisting of two-element compounds consisting of CdSe, CdTe, ZnS, ZnSe, ZnTe, ZnO, HgS, HgSe, HgTe, MgSe, MgS, and a mixture thereof; three-element compounds consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and four-element compounds consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The group III-V compounds may be selected from a group consisting of two-element compounds consisting of GaN, GaP, GaAs, GaSb, AlN, AlP, AlAs, AlSb, InN, InP, InAs, InSb, and a mixture thereof; three-element compounds consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and four-element compounds consisting of GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The group IV-VI compounds may be selected from a group consisting of two-element compounds consisting of SnS, SnSe, SnTe, PbS, PbSe, PbTe, and a mixture thereof; three-element compounds consisting of SnSeS, SnSeTe, SnالسهTe, PbSeS, PbSeTe, PbSTe, SnPbS, SnPbSe, SnPbTe, and a mixture thereof; and four-element compounds consisting of SnPbSSe, SnPbSeTe, SnPbSTe, and a mixture thereof. The group IV element may be selected from a group of Si, Ge, and a mixture thereof. The group IV compound may be a two-element compound selected from a group of SiC, SiGe, and a mixture thereof.

The two-element compound, the three-element compound, or the four-element compound may be present in the particle at a uniform concentration, or may be present in the same particle after being partially divided into states of which concentration dispersion is partially different. They may have a core/shell structure in which one quantum dot surrounds another quantum dot. An interfacing surface between the core and the shell may have a concentration gradient in which a concentration of an element decreases closer to its center.

Shapes of the quantum dots are not specifically limited to shapes that are generally used in the related art. For example, a nanoparticle having a spherical, pyramidal, multi-arm, or cubic shape, a nanotube, a nanowire, a nanofiber, and a planar nanoparticle may be used.

A second insulation layer 240b is disposed on the transparent filter layer 300a, the first color conversion layer 300b, and the second color conversion layer 300c. The second insulation layer 240b covers the transparent filter layer 300a, the first color conversion layer 300b, and the second color conversion layer 300c for protection such that components of a filling layer 280 disposed when the color conversion panel 2000 is attached to the display panel 1000 can be prevented from being introduced into the transparent filter layer 300a, the first color conversion layer 300b, and the second color conversion layer 300c.

The light of the first wavelength emitted from the display panel 1000 is incident on the transparent filter layer 300a, the first color conversion layer 300b, and the second color conversion layer 300c, and thus the light of the first wavelength is scattered and transmitted in an area where the transparent filter layer 300a is disposed and thus emitted toward the second substrate 210, the light of the first wavelength is converted into light of a second wavelength in an area where the first color conversion layer 300b is disposed and thus emitted toward the second substrate 210, and the light of the first wavelength is color-converted into light of a third wavelength and thus emitted toward the second substrate 210 in an area where the second color conversion layer 300c is disposed.

Color purity may be increased by the color filters 230a, 230b, and 230c disposed between the second substrate 210, the transparent filter layer 300a, the first color conversion layer 300b, and the second color conversion layer 300c.

The first color filter 230a may transmit light of the first wavelength passed through the transparent filter layer 300a and may absorb light of the remaining wavelengths such that purity of the light of the first wavelength emitted toward the second substrate 210 can be increased. The second color filter 230b may transmit light of the second wavelength and may absorb light of the remaining wavelengths such that purity of the light of the second wavelength emitted toward the second substrate 210 can be increased, and similarly, the third color filter 230c may transmit light of the third wavelength and may absorb light of the remaining wavelengths such that purity of the light of the second wavelength emitted toward the second substrate 210 can be increased.

A blocking layer 220a may be disposed where the first color conversion layer 300b and the second color conversion layer 300c overlap the second substrate 210, and the blocking layer 220a may block (e.g., absorb) the light of the first wavelength emitted toward the second substrate 210 without being color-converted in the first color conversion layer 300b and the second color conversion layer 300c such that purity of the light of the second wavelength and purity of the light of the third wavelength can be increased.

The blocking layer 220a may substantially block (e.g., absorb) the light of the first wavelength, and may transmit the light of the remaining wavelengths. For example, the blocking layer 220a may substantially block blue light of a wavelength of about 500 nm or less, and may transmit light of the remaining wavelengths, for example, a visible light wavelength range of greater than about 500 nm and less than 700 nm. For example, the blocking layer 220a may absorb about 80% or more, about 90% or more, or about 95% or more of blue light of about 500 nm or less, and may have light transmittance of about 70% or more, about 80% or more, about 90% or more, or about 100% with respect to the remaining visible light of more than about 500 nm to 700 nm or less.

The blocking member 220, the partitioning wall 250, the reflective layer 260, and the overcoat 270 may be disposed to overlap an opaque area of the display panel 1000, and the transparent filter layer 300a, the first color conversion layer 300b, and the second color conversion layer 300c may be disposed to overlap a light emission area of the display panel 1000.

As described above, the reflective layer 260 and the overcoat 270 can be simultaneously formed, thereby preventing an increase of manufacturing cost. The overcoat 270 and the spacer 270a may be formed of a single layer, and may be formed using one exposure mask during the manufacturing process, thereby preventing an increase in manufacturing cost. This will be described later in more detail.

A method for manufacturing a color conversion panel and a display device including the same according to an embodiment will be described with reference to FIG. 3 to FIG. 10 together with FIG. 1 and FIG. 2. FIG. 3 to FIG. 10 are schematic cross-sectional views of a method for manufacturing a color conversion panel according to an embodiment in the manufacturing order.

Figure 3:
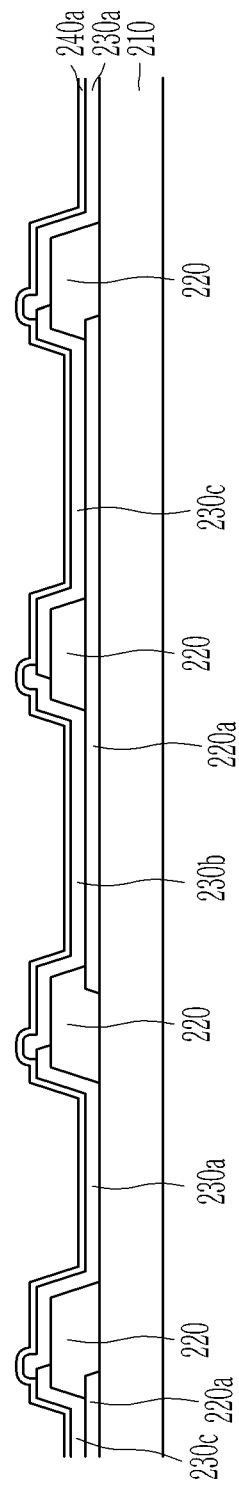
FIG. 3 to FIG. 11 are schematic cross-sectional views of a method for manufacturing a color conversion panel according to the manufacturing order according to an embodiment.

Referring to FIG. 3, a blocking layer 220a and a light blocking member 220 are sequentially formed on a second substrate 210, a first color filter 230a, a second color filter 230b, and a third color filter 230c are formed on the second substrate 210 and the light blocking member 220, and a first insulation layer 240a is stacked on the first color filter 230a, the second color filter 230b, and the third color filter 230c. As shown in FIG. 3, the blocking layer 220a is disposed only below the second color filter 230b and the third color filter 230c, and is not disposed below the first color filter 230a.

Figure 4:
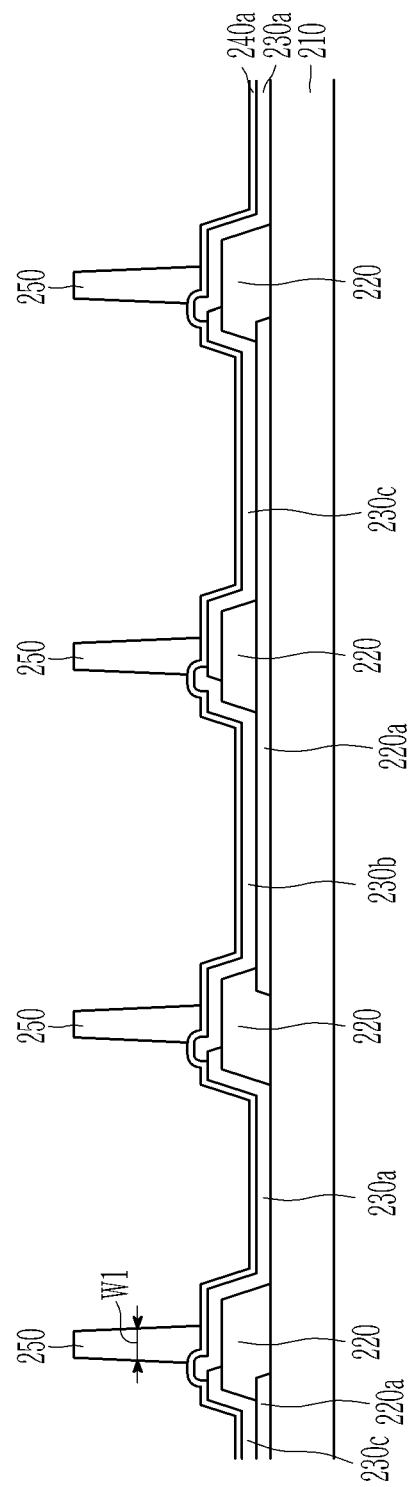

Referring to FIG. 4, partitioning walls 250 are formed to overlap light blocking members 220 on the first insulation layer 240a. The partitioning wall 250 may be formed of an opaque insulation layer, but this is not restrictive, and may have photosensitivity. A width W1 of the partitioning wall 250 may be about 4 m, and the width W1 of the partitioning wall 250 may be narrower than a width of the light blocking member 220.

Figure 5:
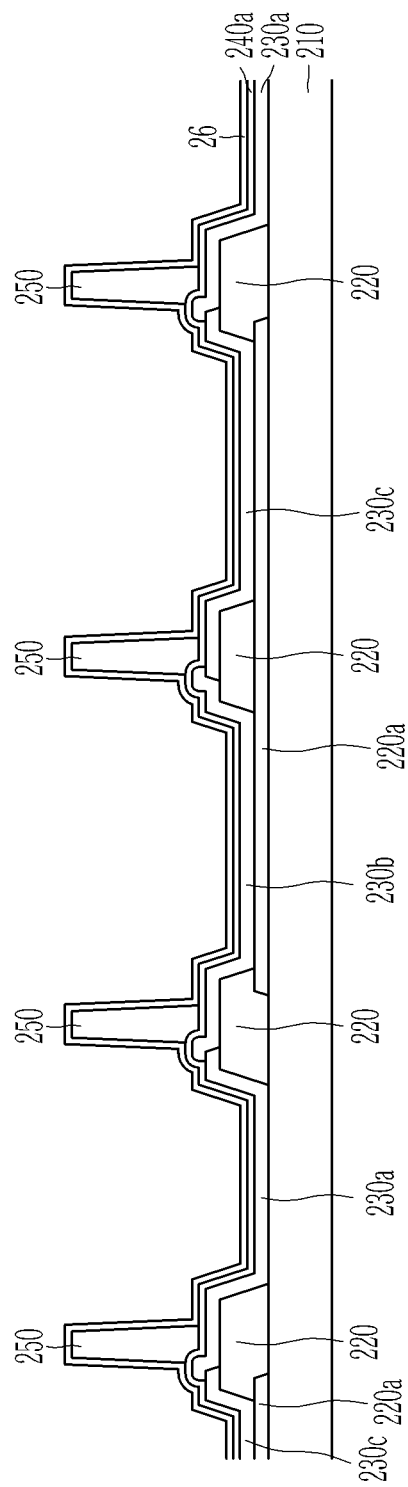

Referring to FIG. 5, a reflective material layer 26 is stacked throughout the second substrate 210 that includes the partitioning walls 250. The reflective material layer 26 may be a reflective metal, for example, aluminum or silver.

Figure 6:
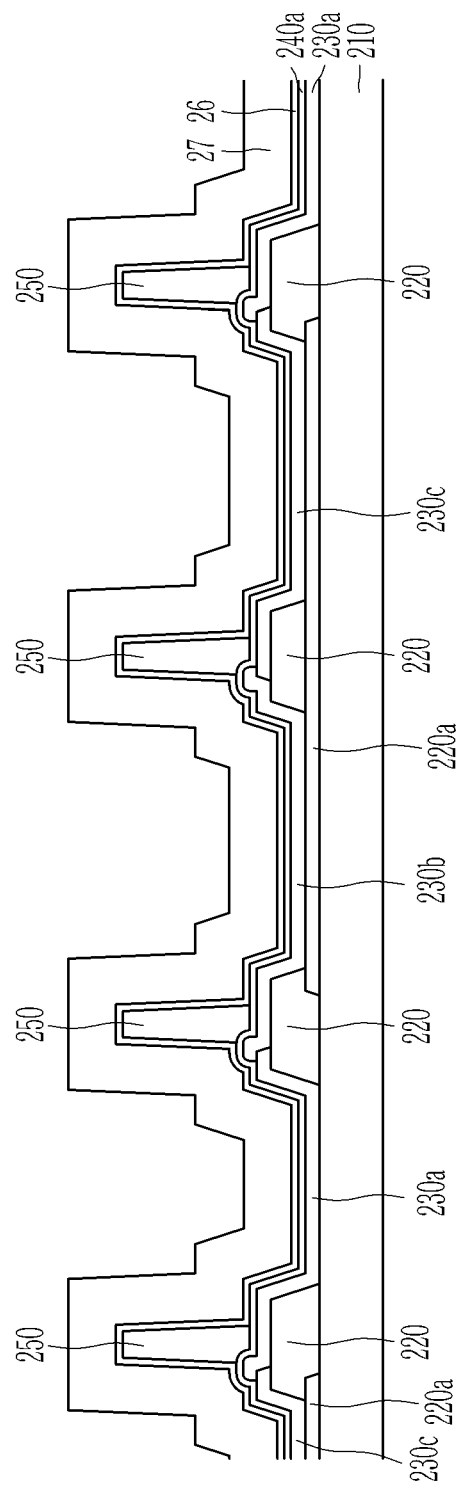

Referring to FIG. 6, a water-repellent layer 27 is stacked throughout the second substrate 210 on the reflective material layer 26. The water-repellent layer 27 may include a transparent organic material, and may have water repellency. The water-repellent layer 27 may have photosensitivity.

Figure 7:
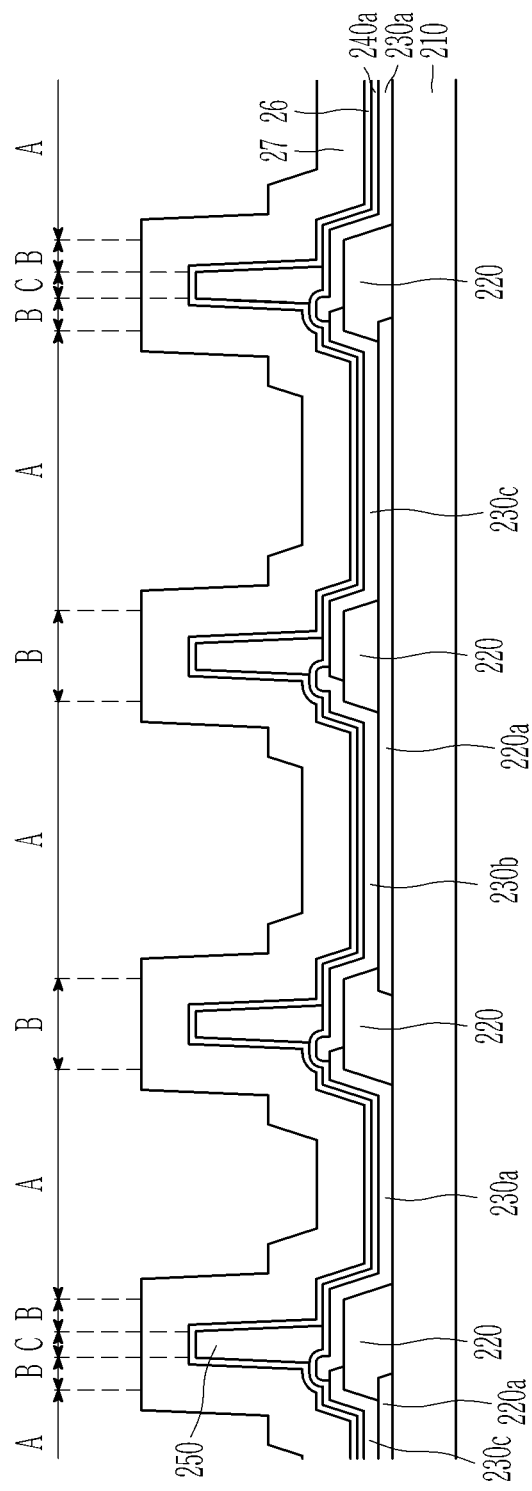

Referring to FIG. 7, the water-repellent layer 27 is exposed and developed by using an exposure mask that includes first areas A, second areas B, and third areas C, each having different light transmittance.

The first area A is an area where the water-repellent layer 27 will be removed, the second area B is an area where the water-repellent layer 27 will partially remain, and the third area C is an area where much more water-repellent layer 27 will remain compared to the second area B, and most of the water-repellent layer 27 positioned in the third region C remains.

For example, when the water-repellent layer 27 has positive photosensitivity, the first region A may be a transmissive area through which the light of an exposer is completely transmitted, the third area C of the exposure mask may be an opaque area that completely blocks the light of the exposer, and the second area B of the exposure mask may be a semi-transmissive area that transmits only a part of the light of the exposer. On the contrary, when the water-repellent layer 27 has negative photosensitivity, the first area A of the exposure mask may be an opaque area that completely blocks the light of the exposer, the third area C of the exposure mask may be a transmissive area through which the light of an exposer is completely transmitted, and the second area B of the exposure mask may be a semi-transmissive area that transmits only a part of the light of the exposer.

Figure 8:
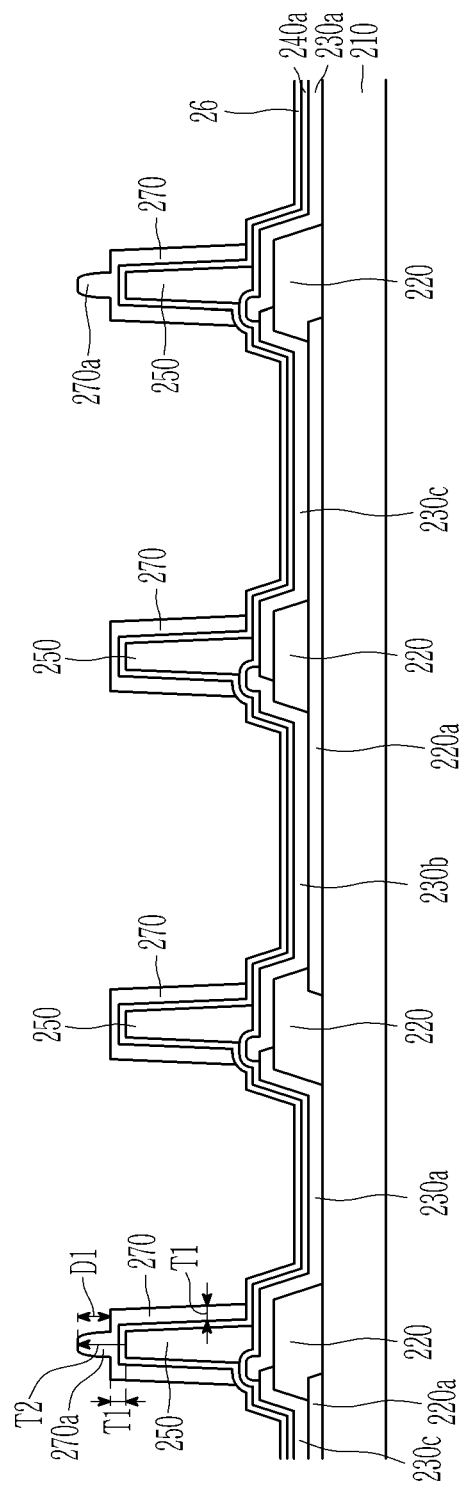

As described, the water-repellent layer 27 is exposed and developed using a halftone mask including a first area A, a second area B, and a third area C having different light transmission levels, and as shown in FIG. 8, an overcoat 270 having a first thickness T1 and a spacer 270a having a second thickness T2 that is thicker than the first thickness T1 are formed. The overcoat 270 and the spacer 270a may be formed on a same layer and may be formed simultaneously.

The spacers 270a are protruded from portions of overcoats 270.

A height difference D1 is formed between the portion where the spacer 270a is disposed and a portion where the spacer 270a is not disposed due to a difference between a first thickness T1 of the overcoat 270 a second thickness T2 of the spacer 270a. For example, the first thickness T1 of the overcoat 270 may be about 3 m, and the second thickness T2 of the spacer 270a may be about 4 m. The height difference D1 may be about 1 m. A constant gap between the display panel 1000 and the transparent filter layer 300a, the first color conversion layer 300b, and the second color conversion layer 300c of the color conversion panel 2000 can be maintained by the spacer 270a.

Figure 9:
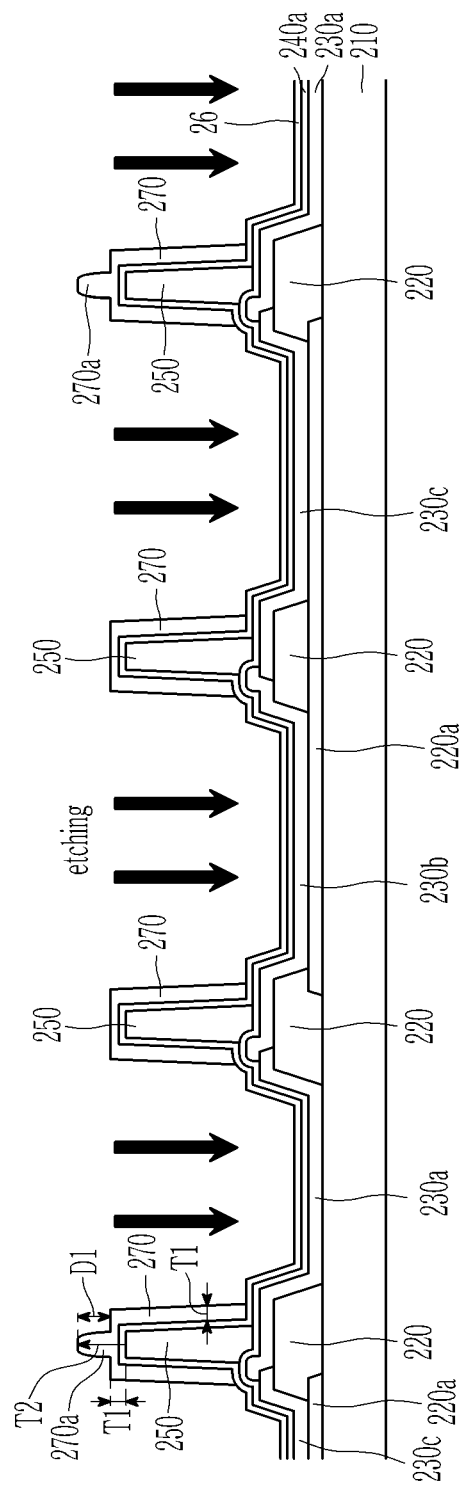
Figure 10:
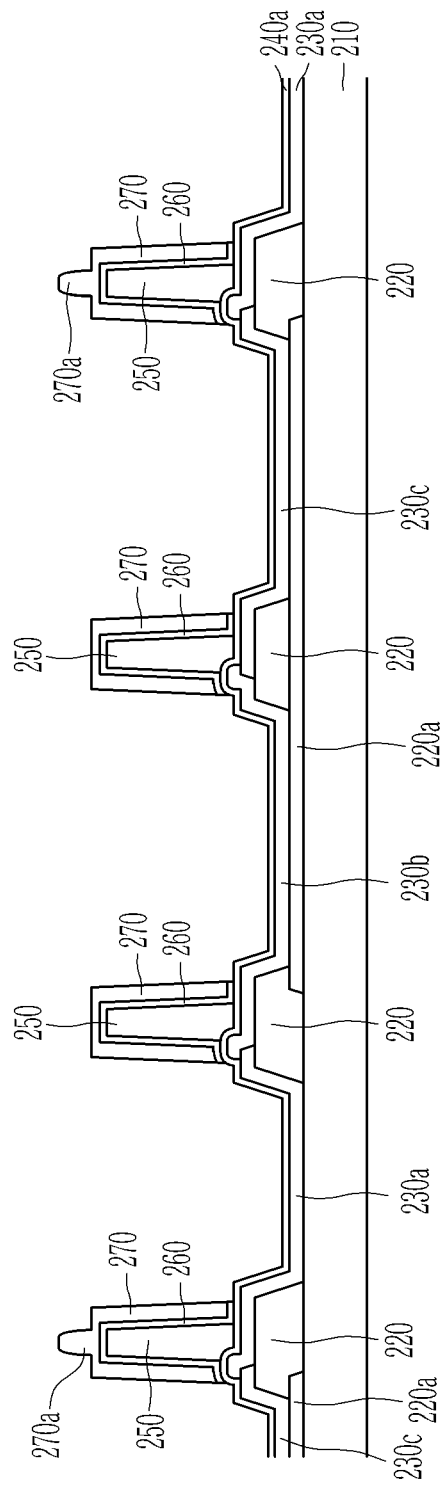

As shown in FIG. 9, the reflective material layer 26 is etched by using the overcoat 270 and the spacer 270a as an etching mask, and thus, as shown in FIG. 10, the reflective layer 260 having edges that vertically overlap edges of the overcoat 270 is formed.

As described, the reflective material layer 26 and the water-repellent layer 27 are sequentially stacked and the water-repellent layer 27 is patterned by using the halftone exposure mask, and then the reflective material layer 26 is etched by using the overcoat 270 and the spacer 270a as an etching mask such that the reflective layer 260, the overcoat 270, and the spacer 270a can be simultaneously formed. Thus, light efficiency can be increased by using the reflective layer 260, and at the same time, the accuracy in the manufacturing process using the inkjet method can be increased by the overcoat 270, and a constant gap between the display panel 1000 and the transparent filter layer 300a, the first color conversion layer 300b, and the second color conversion layer 300c of the color conversion panel 2000 can be maintained by the spacer 270a, which prevents the increase of the manufacturing cost.

Figure 11:
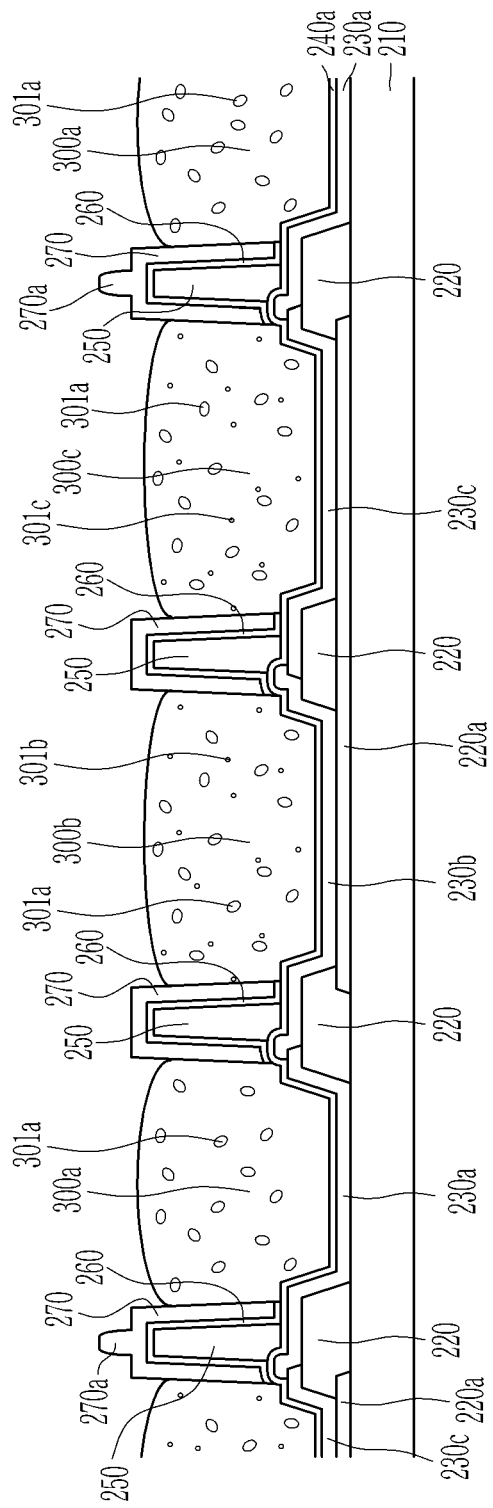

Referring to FIG. 11, the transparent filter layer 300a, the first color conversion layer 300b, and the second color conversion layer 300c are formed in the areas defined by the partitioning walls 250 covered by the reflective layer 260 and the overcoat 270 by using an inkjet method.

When the transparent filter layer 300a, the first color conversion layer 300b, and the second color conversion layer 300c are formed by using the inkjet method, the overcoat 270 having water repellency surrounds the reflective layer 260 on the partitioning wall 250 and thus discharged liquid that forms transparent filter layer 300a, the first color conversion layer 300b, and the second color conversion layer 300c can be dispersed toward areas defined by the partitioning walls 250 rather than being dispersed upward of the partitioning walls 250.

The display panel 1000 emitting light to the color conversion panel 2000 may emit light of the first wavelength, and the transparent filter layer 300a transmits the light of the first wavelength and includes scatterers 301a.

The first color conversion layer 300b converts the light of the first wavelength entering from the display panel 1000 into light of the second wavelength, and includes scatterers 301a and first quantum dots 301b. The second color conversion layer 300c converts the light of the first wavelength entering from the display panel 1000 into light of a third wavelength, and includes scatterers 301a and second quantum dots 301c.

As shown in FIG. 2, the second insulation layer 240b is stacked on the overcoat 270, the spacer 270a, the transparent filter layer 300a, the first color conversion layer 300b, and the second color conversion layer 300c, and, as shown in FIG. 1, the first substrate 110 of the display panel 1000 and the second substrate 210 of the color conversion panel 2000 are disposed to face each other, and then the filling layer 280 is filled between the display panel 1000 and the second insulation layer 240b and then assembled such that a display device is formed.

As described, according to the color conversion panel, the display device including the color conversion panel, and the manufacturing method thereof, light passed through the transparent filter layer 300a, the first color conversion layer 300b, and the second color conversion layer 300c is reflected by the reflective layer 260 that surrounds the outer surfaces of the partitioning walls 250 and is then reflected again to the outside, thereby increasing light efficiency.

The overcoat 270 covering the reflective layer 260 has water repellency, and thus, when the transparent filter layer 300a, the first color conversion layer 300b, and the second color conversion layer 300c are formed by an inkjet method, the overcoat 270 helps the inkjet solution to be located at a center of an area defined by the partitioning walls 250 rather than above or at the periphery of the partitioning walls 250.

The reflective layer 260, the overcoat 270, and the spacer 270a may be formed using one exposure mask, and accordingly, an increase of manufacturing cost can be prevented.

Figure 12:
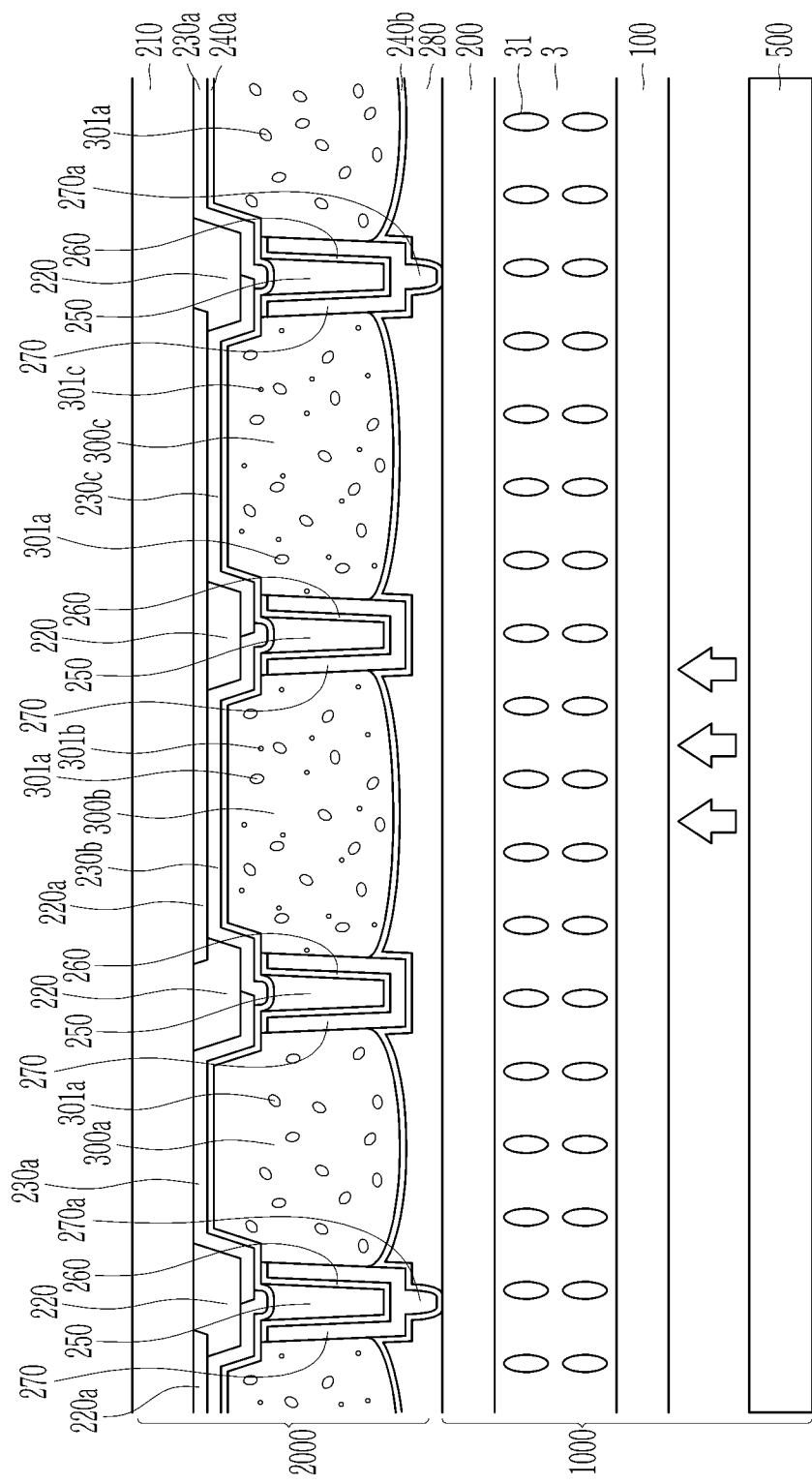
FIG. 12 is a schematic cross-sectional view of a display device according to another embodiment.

Referring to FIG. 12, a display device according to another embodiment will be described. FIG. 12 is a schematic cross-sectional view of a display device according to an embodiment.

Referring to FIG. 12, a display device according to the embodiment is similar to the display device shown in FIG. 1.

However, unlike the display device shown in FIG. 1, the display device according to the embodiment may include a first display panel 100, a second display panel 200 that overlaps the first display panel 200, and a liquid crystal layer 3 that is disposed between the first display panel 100 and the second display panel 200 and includes liquid crystal molecules 31.

For example, the first display panel 100 may include a thin film transistor and a pixel electrode, and the second display panel 200 may include a common electrode. However, such a structure of the display panel 1000 is just an example, and the display panel 1000 may include only one substrate.

The display panel 1000 may include a light emitting device 500 that is disposed outside the first display panel 100 and thus supplies light. The light emitting device 500 may emit light of a first wavelength. For example, the light emitting device 500 may emit blue light.

A color conversion panel 2000 of the display device of FIG. 12 is the same as the color conversion panel 2000 according to the embodiment of FIG. 1.

As previously described with reference to FIG. 2, the color conversion panel 2000 includes light blocking members 220, first to third color filters 230a, 230b, and 230c, a first insulation layer 240a, partitioning walls 250, a reflective layer 260, overcoats 270, spacers 270a, a transparent filter layer 300a, a first color conversion layer 300b, a second color conversion layer 300c, and a second insulation layer 240b disposed between the second substrate 210 and the display panel 1000. A filling layer 280 is disposed between the second insulation layer 240b and the display panel 1000. The color conversion panel 2000 may further include blocking layers 220a disposed between the second substrate 210, and the second color filter 230b and the third color filter 230c.

Light passed through the transparent filter layer 300a, the first color conversion layer 300b, and the second color conversion layer 300c is reflected by the reflective layer 260 that surrounds the outer side of the partitioning wall 250 and is then reflected to the outside such that light efficiency can be increased. For example, compared to a case that the reflective layer 260 is not provided, the light efficiency may be increased by at least about 20%.

The overcoat 270 covering the reflective layer 260 has water repellency, and thus when the transparent filter layer 300a, the first color conversion layer 300b, and the second color conversion layer 300c are formed by using an inkjet method, the overcoat 270 helps the inkjet solution to be located at a center of an area defined by the partitioning walls 250 rather than above or at the periphery of the partitioning walls 250.

A constant gap between the display panel 1000, the transparent filter layer 300a, the first color conversion layer 300b, and the second color conversion layer 300c can be maintained by the spacer 270a.

The reflective layer 260, the overcoat 270, and the spacer 270a may be formed by one exposure mask, and accordingly an increase of manufacturing cost can be prevented.

The features of the embodiments described with reference to FIG. 1 to FIG. 11 are applicable to the embodiment of FIG. 12.

While this invention has been described in connection with what is considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A color conversion panel forming method comprising:
   forming a plurality of partitioning walls on a substrate;
   disposing a metal layer and a water-repellent layer on the substrate;
   forming a plurality of overcoats on the plurality of partitioning walls and forming a spacer protruding from a part of the plurality of overcoats by patterning the water-repellent layer with an exposure mask that includes three areas, each of the three areas having a different light transmittance, wherein the spacer and the plurality of overcoats form a unitary layer, and the spacer is made of the same material as the plurality of overcoats;
   forming a reflective layer disposed between the plurality of partitioning walls and the plurality of overcoats by etching the metal layer using the plurality of overcoats and the spacer as a mask; and
   forming a color conversion layer disposed on the plurality of overcoats in an area defined by the plurality of partitioning walls.

2. The color conversion panel forming method of claim 1, wherein the water-repellent layer comprises a transparent organic component, and has water repellency.

3. The color conversion panel forming method of claim 2, wherein the color conversion layer is formed using an inkjet method.

4. The color conversion panel forming method of claim 2, wherein the color conversion layer comprises a plurality of quantum dots.

5. The color conversion panel forming method of claim 1, wherein the three areas of the exposure mask comprise:
   a first area where the water repellent layer is fully removed;
   a second area where the plurality of partitioning walls are formed; and
   a third area where the spacer is formed.

6. The color conversion panel forming method of claim 1, wherein the plurality of overcoats and the spacer comprise transparent organic components, and have water repellency.

7. The color conversion panel forming method of claim 1, wherein the metal layer comprises a reflective metal.

* * * * *